US011881817B2

(12) United States Patent
Milicevic et al.

(10) Patent No.: US 11,881,817 B2
(45) Date of Patent: Jan. 23, 2024

(54) LOW POWER OSCILLATOR WITH VARIABLE DUTY CYCLE AND METHOD THEREFOR

(71) Applicant: SEMICONDUCTOR COMPONENTS INDUSTRIES, LLC, Phoenix, AZ (US)

(72) Inventors: Sinisa Milicevic, Waterloo (CA); Alexander Heubi, La Chaux-de-Fonds (CH); Noureddine Senouci, Le Landeron (CH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/806,308

(22) Filed: Jun. 10, 2022

(65) Prior Publication Data

US 2023/0056841 A1 Feb. 23, 2023

Related U.S. Application Data

(60) Provisional application No. 63/260,468, filed on Aug. 20, 2021.

(51) Int. Cl.
*H03B 5/36* (2006.01)
*H03K 5/01* (2006.01)

(52) U.S. Cl.
CPC ............... *H03B 5/364* (2013.01); *H03K 5/01* (2013.01); *H03B 2200/0082* (2013.01)

(58) Field of Classification Search
CPC .......... H03B 5/36; H03B 5/362; H03B 5/364; H03B 5/366; H03B 5/368; H03B 5/32; H03B 2200/0064; H03K 3/017; H03K 5/1565
See application file for complete search history.

(56) References Cited

U.S. PATENT DOCUMENTS

2006/0071725 A1* 4/2006 Nunokawa .............. H03B 5/32 331/74
2022/0209717 A1* 6/2022 Yamamoto ................ G06F 1/04

FOREIGN PATENT DOCUMENTS

CN 107294513 A * 10/2017 ............. H03K 3/351

* cited by examiner

*Primary Examiner* — Ryan Johnson
(74) *Attorney, Agent, or Firm* — Polansky & Associates, P.L.L.C.; Paul J. Polansky

(57) ABSTRACT

An oscillator includes first and second capacitors, an inverter, a voltage shifting circuit, and a hysteresis buffer. The first and second capacitors have first terminals adapted to be coupled to respective first and second nodes, and second terminals coupled to ground. The inverter has an input coupled to the first node, and an output coupled to the second node. The voltage shifting circuit is coupled to the first and second nodes and has an input for receiving a tuning signal. The voltage shifting circuit changes an average voltage at the first node according to the tuning signal when an oscillation occurs in response to a crystal being coupled between the first and second nodes. The hysteresis buffer has an input coupled to one of first node and the second node, and an output for providing a clock signal having a duty cycle responsive to the tuning signal.

20 Claims, 3 Drawing Sheets

400
420
$I_{bias}$
461
464
463
470
460
$C_{tune}$
$M_1$
$M_2$
$V_1$
$V_2$
$V_{OUT}$
462
450
421
422
$X_1$
430
410
440
$C_1$
$C_2$

LOW POWER OSCILLATOR WITH VARIABLE DUTY CYCLE AND METHOD THEREFOR

This application claims the benefit of U.S. Patent Application No. 63/260,468, filed Aug. 20, 2021, the entire contents of which are incorporated herein by reference.

FIELD OF THE DISCLOSURE

This disclosure relates generally to oscillators, and more particularly, to oscillators and oscillator circuits that provide clock output signal with a variable duty cycle.

BACKGROUND

An oscillator is a circuit that provides a repeatedly varying signal. The oscillator oscillates at a frequency at which its closed loop gain is zero degrees, and requires a loop gain of greater than one. Oscillator circuits are common electrical circuits used in analog and digital communication and as timing reference for digital circuits. For digital timing references, sinusoidal waveforms are converted into digital signals using hysteresis buffers.

Many oscillators are built on crystal references formed using piezoelectric quartz crystals. The crystal's physical size and properties are used to establish oscillation at a desired frequency. A typical oscillator is a so-called Pierce oscillator that is used as a clock source for digital integrated circuits, in which the crystal and two tank capacitors are off-chip, and the gain element, the hysteretic buffer, and a biasing resistor are on-chip. While this type of oscillator has been in common use for many years for many integrated circuits, it requires a lot of integrated circuit area and consumes a lot of current, and further improvements are desirable.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
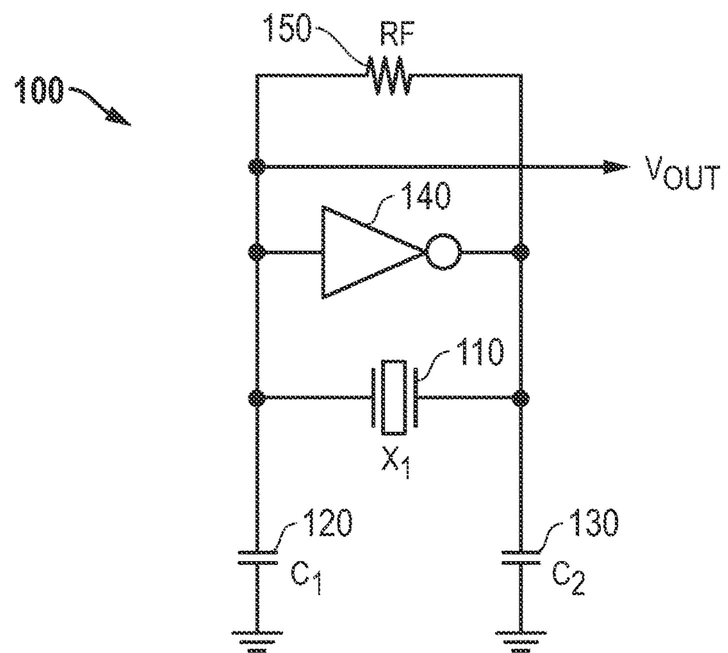
FIG. 1 illustrates in schematic form a crystal oscillator circuit known in the prior art.

FIG. 1 illustrates in schematic form a crystal oscillator circuit 100 known in the prior art. Crystal oscillator circuit 100 includes a crystal 110, capacitors 120 and 130, an inverter 140, and a resistor 150. Crystal 110 is a piezoelectric crystal that establishes a natural oscillation frequency based on its physical structure and has a first terminal that forms an output of crystal oscillator circuit 100 for providing an output voltage labelled "$V_{OUT}$", and a second terminal. Capacitor 120 has a first terminal connected to the first terminal of crystal 110, a second terminal connected to ground, and has an associated capacitance labelled "$C_1$". Capacitor 130 has a first terminal connected to the second terminal of crystal 110, a second terminal connected to ground, and has an associated capacitance labelled "$C_2$". Inverter 140 has an input connected to the first terminal of crystal 110, and an output connected to the second terminal of crystal 110. Resistor 150 has a first terminal connected to the first terminal of crystal 110, and a second terminal connected to the second terminal of crystal 110, and has an associated resistance labelled "RF".

Crystal oscillator circuit 100 is a type of oscillator known as a Pierce oscillator and establishes oscillation when an inverter is connected between its first and second terminals. Crystal oscillator circuit 100 oscillates at its series resonance frequency. Inverter 140 is initially biased into the middle of its operating region by resistor 150. Inverter 140 provides a 180° phase shift and capacitors 120 and 130 provide an additional 180° phase shift that produces oscillation. Crystal oscillator circuit 100 automatically adjusts itself to maintain a 360° phase shift to sustain oscillation. Crystal oscillator circuit 100 provides $V_{OUT}$ as a sinusoidal waveform, but an additional circuit such as a Schmitt trigger can be added to transform the sinusoidal signal into a square wave digital signal, making it useful as a digital clock signal.

Crystal oscillator circuit 100 can be used to generate digital clock signals for many types of integrated circuits such as microcontrollers. In a typical microcontroller implementation, crystal 110 and capacitors 120 and 130 are external to the integrated circuit, whereas inverter 140 and resistor 150 are internal to the integrated circuit. While crystal oscillator circuit 100 has been very popular for many applications, it has some drawbacks and is less than ideal for some applications because of the need for costly external components and because of the non-ideal nature of the internal components.

Figure 2:
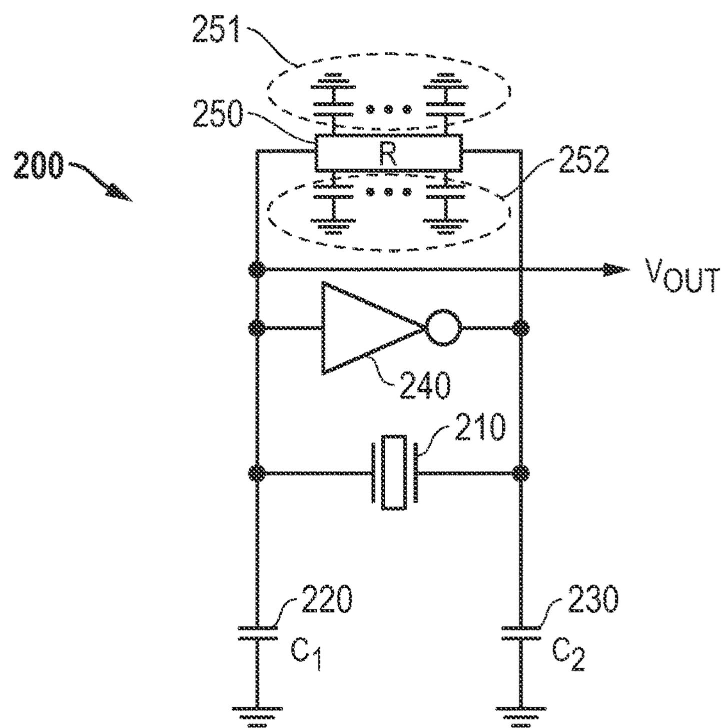
FIG. 2 illustrates in schematic form a crystal oscillator circuit known in the prior art showing an electrical model of the feedback resistor.

FIG. 2 illustrates in schematic form a crystal oscillator circuit 200 known in the prior art showing an electrical model of the feedback resistor. Crystal oscillator circuit 200 includes a crystal 210, capacitors 220 and 230, an inverter 240, and a resistor 250. Crystal 210 has a first terminal that forms an output of crystal oscillator circuit 200 for providing an output voltage "$V_{OUT}$", and a second terminal. Capacitor 220 has a first terminal connected to the first terminal of crystal 210, a second terminal connected to ground, and has an associated capacitance $C_1$ Capacitor 230 has a first terminal connected to the second terminal of crystal 210, a second terminal connected to ground, and has an associated capacitance $C_2$. Inverter 240 has an input connected to the first terminal of crystal 210, and an output connected to the second terminal of crystal 210. Resistor 250 has a first terminal connected to the first terminal of crystal 210, and a second terminal connected to the second terminal of crystal 210.

In a typical implementation, crystal 210 has an oscillation frequency of 32,768 Hertz (Hz), which is $2^{15}$ and thereby allows the easy generation of a one-second real-time clock signal using a 15-bit counter. These crystals are widely manufactured and therefore less expensive. However, to sustain oscillation at this frequency, resistor 250 needs to have a resistance on the order of 10-15 megohms (MΩ). Forming a resistor having a resistance this high requires a lot of integrated circuit area because of the relatively low resistivity of doped silicon. The layout of the large resistor also produces a very large parasitic capacitance. FIG. 2 shows this parasitic capacitance as a series of capacitors 251 distributed along one side of resistor 250 and another series of capacitors 252 distributed along the other side of resistor 250. This large parasitic capacitance reduces the trimming capability of crystal oscillator circuit 200.

For example, in a 22 nanometer (22 nm) complementary metal-oxide-semiconductor (CMOS) manufacturing process with a power supply voltage of 1.0 volts (V) and a resistor value of 10 MΩ, resistor 250 requires a chip area of 2800 square microns (2800 $\mu m^2$). The parasitic capacitance is 5.563 picofarads (pF), and the extra operating current caused by the parasitic capacitance alone is about 183 nano Amperes (nA).

As noted above, the sinusoidal output of crystal oscillator circuit 100 requires another circuit to transform it into a square wave more useful in digital logic circuits. This other circuit can also advantageously be used to vary the duty cycle.

Figure 3:
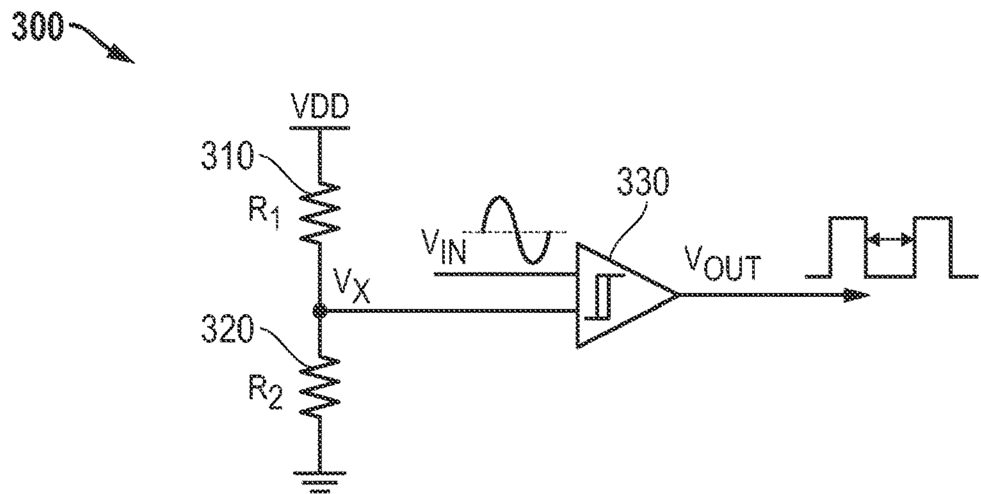
FIG. 3 illustrates in partial block diagram and partial schematic form a duty cycle adjustment circuit for use with the crystal oscillator circuit of FIG. 1.

FIG. 3 illustrates in partial block diagram and partial schematic form a duty cycle adjustment circuit 300 for use with crystal oscillator circuit 100 of FIG. 1. Duty cycle adjustment circuit 300 includes a resistor 310, a resistor 320, and a Schmitt trigger circuit 330. Resistor 310 has a first terminal connected to a power supply voltage terminal labelled "VDD" and a second terminal for providing a voltage labelled "$V_X$", and has an associated resistance labelled "$R_1$". Resistor 320 has a first terminal connected to the second terminal of resistor 310, and a second terminal connected to ground. Schmitt trigger 330 has a first input terminal for receiving a voltage labelled "$V_{IN}$" from the crystal oscillator, a second input connected to the second terminal of resistor 310, and an output for providing a square-wave output signal with a variable duty cycle.

Schmitt trigger circuit 330 operates as a hysteresis buffer that has different thresholds for the rising and falling edges to prevent jitter in the clock edges due to random noise. The use of resistors 310 and 320 also provides the capability to vary the duty cycle of $V_{OUT}$. If $V_{IN}$ is equal to the average voltage of the sinusoidal waveform, then $V_{OUT}$ will have a 50% duty cycle. However, as $V_{IN}$ rises above the average voltage, it "cuts" the sinusoidal waveform higher such that the time during which $V_X$ is greater than $V_{IN}$ is longer, thereby increasing the duty cycle above 50%. Conversely, as $V_{IN}$ falls below the average voltage, it "cuts" the sinusoidal waveform higher such that the time during which $V_X$ is greater than $V_{IN}$ is longer, thereby decreasing the duty cycle below 50%.

If the resistors are implemented in segments with corresponding switches, the value of $V_X$ can be digitally tuned by selecting the appropriate number of segments to vary $V_X$ and hence the duty cycle as desired. However, this creates other problems. If the nominal values of R1 and R2 are too high, then duty cycle adjustment circuit 300 will consume a lot of chip area. If the nominal values of R1 and R2 are too low, then duty cycle adjustment circuit 300 will consume a lot of static current.

Moreover, in order to convert the sine wave signal from the crystal pins into a square wave one at the output of the Schmitt trigger, the voltage swing of this sine wave should be high enough to reach the high triggering point and low enough high to reach the low triggering point of the Schmidt trigger. If the average (DC) level of the oscillation varies and cannot be trimmed, then the oscillator circuit needs a high signal swing to reach the Schmidt trigger threshold levels. To obtain a high signal swing, the bias current of crystal oscillator would need to be high, which translates into a high current consumption in order to have a high signal amplitude.

Figure 4:
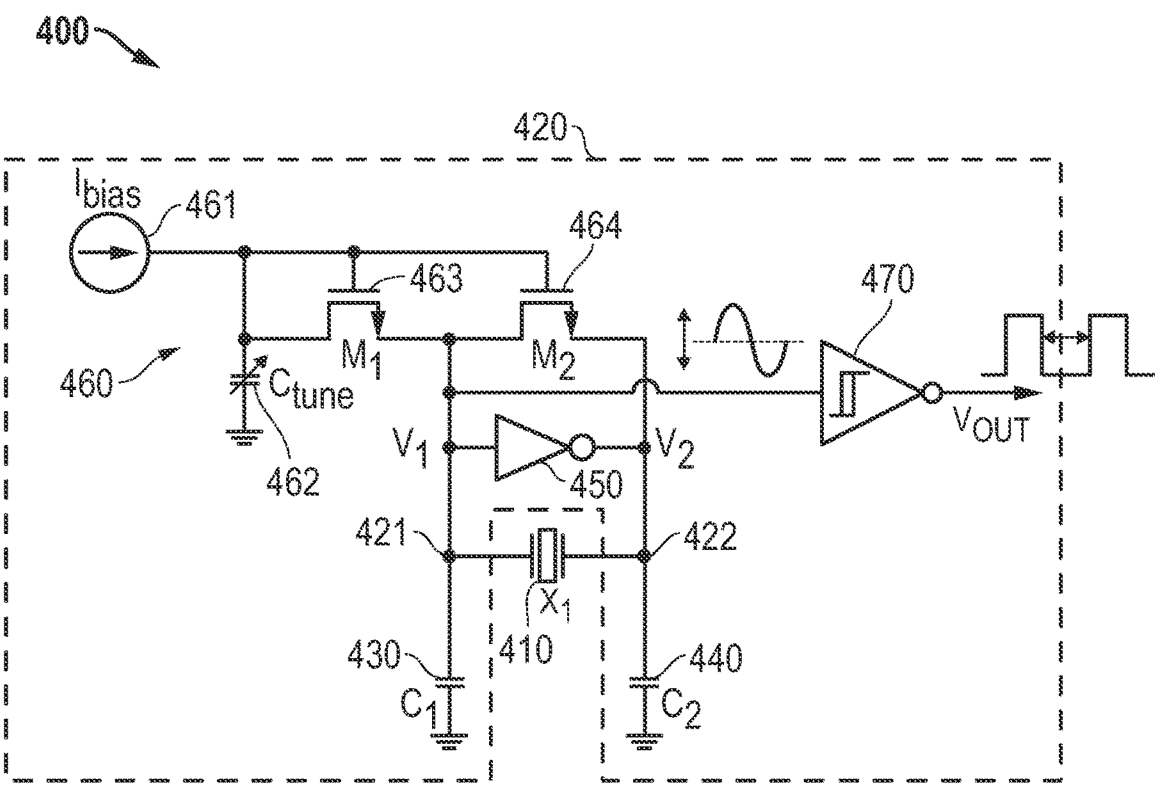
FIG. 4 illustrates in partial block diagram and partial schematic form a crystal oscillator circuit with duty cycle adjustment according to various embodiments of the present disclosure.

FIG. 4 illustrates in partial block diagram and partial schematic form a crystal oscillator circuit 400 with duty cycle adjustment according to various embodiments of the present disclosure. Crystal oscillator circuit 400 includes generally a crystal 410 and an integrated circuit 420 having nodes 421 and 422 respectively connected to first and second terminals of crystal 410. Crystal 410 is a piezoelectric crystal that establishes a natural oscillation frequency based on its structure and has first and second terminals.

Integrated circuit 420 includes a capacitor 430, a capacitor 440, an inverter 450, a voltage shifting circuit 460, and a hysteresis buffer 470. Capacitor 430 has a first terminal connected to node 421, a second terminal connected to ground, and has an associated capacitance $C_1$. Capacitor 440 has a first terminal connected to node 422, a second terminal connected to ground, and has an associated capacitance Ca. Inverter 450 has an input connected to node 421, and an output connected to node 422. Voltage shifting circuit 460 is connected to nodes 421 and 422 and has an input for receiving a tuning signal labelled "$C_{tune}$". Voltage shifting circuit 460 includes a current source 461, a tunable capacitor 462 having a capacitance set by $C_{tune}$, a transistor 463, and a transistor 464. Current source 461 has an output terminal for providing a bias current to a third node at its output. Tunable capacitor 462 has a first terminal connected to the third node, and a second terminal connected to ground. Transistor 463 is an N-channel metal-oxide-semiconductor (MOS) transistor having a drain connected to the third node, a gate connected to the third node, and a source connected to node 421. Transistor 464 is an N-channel MOS transistor having a drain connected to the source of transistor 463, a gate connected to the third node, and a source connected to node 422. Hysteresis buffer 470 has an input connected to the first node, and an output for providing $V_{OUT}$.

In operation, voltage shifting circuit 460 forms an active impedance by the serial connection of two diode-connected NMOS transistors across nodes N1 and N2 to bias inverter 450 into its operation region. Voltage shifting circuit 460 adds capacitor 462 to the drain of transistor 463 that forms the anode of the diode-connected transistor. By choosing appropriate value for $C_{TUNE}$, the user can affect the DC voltage offset between $V_1$ and $V_2$ without affecting any of the oscillator parameters.

Diode connected transistors 463 and 464 together with capacitor 462 create a charge pump circuit that builds a reference voltage on the $V_1$ terminal. If the $C_1 >> C_{TUNE}$, the oscillator frequency allows the capacitors to fully charge or discharge before changing states. As a result of this charging cycle, $V_1$ will have an increased offset voltage level as a function of the value of $C_{tune}$. The build-up of the voltage on $V_1$ requires several oscillator cycles to reach steady state.

Signal $V_1$ is fed to a hysteresis buffer, such as Schmitt trigger 470, with two fixed threshold voltages. As the DC offset voltage of $V_1$ is changing, the hysteresis buffer forms an output signal as a square waveform with a variable pulse width as a function of the input offset signal, i.e., the generated clock signal has adjustable duty cycle.

In typical CMOS Pierce oscillator design, such as oscillator 100 of FIG. 1, crystal 110 and load capacitors 120 and 130 are dominant when setting the oscillator frequency. Subject to the value of $C_{tune}$ as well as the sizes of transistors 463 and 464, capacitor 462 only modifies the DC offset voltage of $V_1$ without affecting any of the oscillation parameters. As a result of increasing or decreasing the DC value of signal $V_1$, which is input to Schmitt trigger 470 with fixed values of $V_{TH1}$ and $V_{TH2}$, $V_{OUT}$ has a variable pulse width, i.e., a variable duty cycle, as a function of the offset voltage.

Moreover, with this offset adjustment technique, the sine wave amplitude can be kept small and the DC level of this sine wave can be set to be in the Schmidt trigger threshold levels. Thus, crystal oscillator circuit 400 does not require a high bias current and therefore it can be used to create a square wave signal at the output of the Schmidt trigger with low power consumption.

Figure 5:
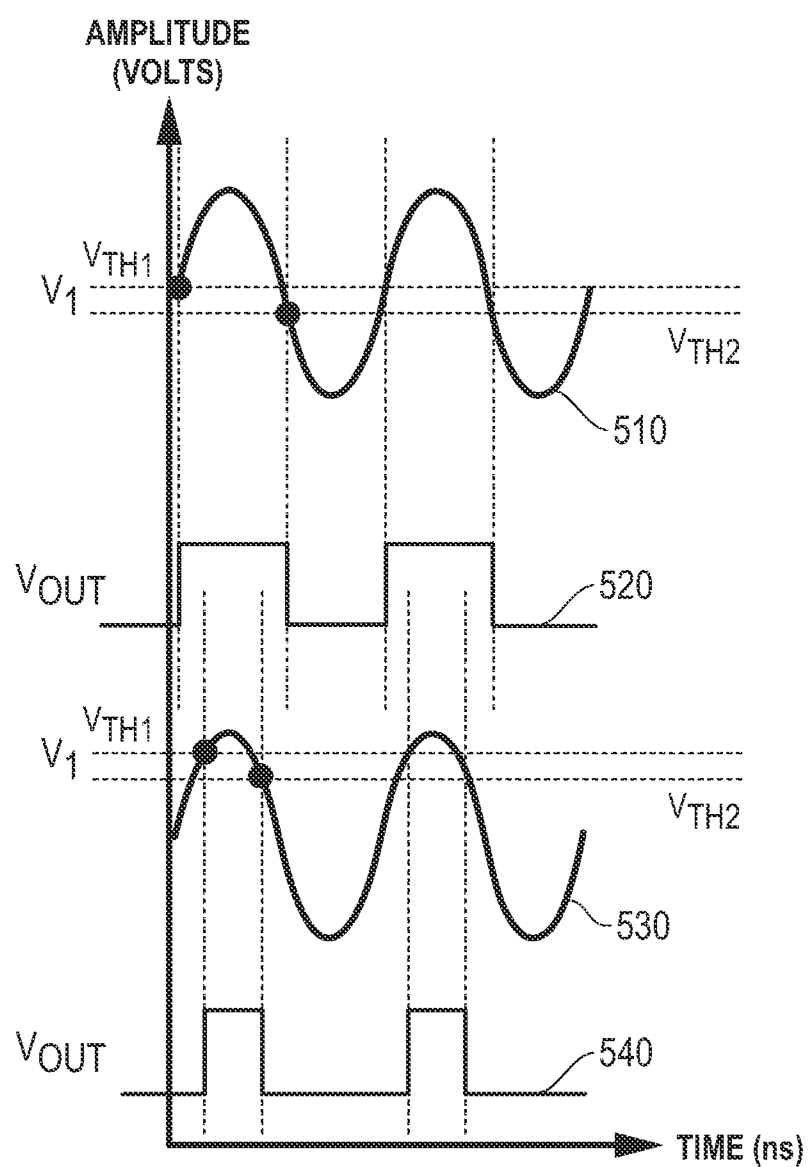
FIG. 5 illustrates a timing diagram showing the operation of the crystal oscillator circuit of FIG. 4.

FIG. 5 illustrates a timing diagram 500 showing the operation of crystal oscillator circuit 400 of FIG. 4. In timing diagram 500, the horizontal axis represents time in nanoseconds (ns), and the vertical axis represents the amplitude of various signal in volts. Shown in FIG. 5 are four waveforms of interest, including a first oscillator $V_1$ waveform 510, a first $V_{OUT}$ waveform 520, a second oscillator $V_1$ waveform 530, and a second $V_{OUT}$ waveform 540. First oscillator waveform 510 is a sine wave that periodically crosses the two thresholds, $V_{TH1}$ and $V_{TH2}$. Schmitt trigger 470 of FIG. 4 is a particular type of hysteresis buffer that inherently has these two thresholds for stability. Vii represents the threshold of Schmitt trigger 470 on the rising edge of the sine wave, whereas $V_{TH2}$ represents the threshold of Schmitt trigger 470 on the falling edge of the sine wave. $V_{OUT}$ waveform 520 is a square wave with approximately 50% duty cycle because, in this example, $C_{tune}$ is set to cause the average value of the sine wave to be about mid-supply. Second oscillator waveform 520 however, is a sine wave that is shifted downward by increasing the value of $C_{tune}$. In this case, $V_{OUT}$ waveform 520 is a square wave much less than 50% duty cycle because, in this example, $C_{tune}$ is set to cause the average value of the sine wave to be less than mid-supply.

The above-disclosed subject matter is to be considered illustrative, and not restrictive, and the appended claims are intended to cover all such modifications, enhancements, and other embodiments that fall within the scope of the claims. For example, while a Schmitt trigger was used in the exemplary embodiment, in other embodiments, other forms of hysteresis buffers may be used. The crystal oscillator circuit can be used with various types of circuits including microcontroller units (MCUs), systems-on-chip (SOCs), and other digital circuits requiring a digital clock signal. In various embodiments, all components can be implemented on a single chip except for the crystal, but other embodiments may integrate fewer elements on chip.

Thus, to the maximum extent allowed by law, the scope of the present invention is to be determined by the broadest permissible interpretation of the following claims and their equivalents, and shall not be restricted or limited by the forgoing detailed description.

What is claimed is:

1. An oscillator, comprising:
- a first capacitor having a first terminal adapted to be coupled to a first node, and a second terminal coupled to ground;
- a second capacitor having a first terminal adapted to be coupled to a second node, and a second terminal coupled to ground;
- an inverter having an input coupled to said first node, and an output coupled to said second node;
- a voltage shifting circuit coupled to said first node and to said second node and having an input for receiving a tuning signal, wherein said voltage shifting circuit changes an average voltage at said first node according to said tuning signal as a function of a value of a tunable capacitor when an oscillation occurs in response to a crystal being coupled between said first node and said second node; and
- a hysteresis buffer, having an input coupled to one of said first node and said second node, and an output for providing a clock signal having a duty cycle responsive to said tuning signal.

2. The oscillator of claim 1, wherein said voltage shifting circuit is characterized as being resistor-less.

3. The oscillator of claim 1, wherein said voltage shifting circuit comprises:
- a current source having an output terminal for providing a bias current to a third node;
- said tunable capacitor having a first terminal coupled to said third node, and a second terminal coupled to ground;
- a first transistor having a first current electrode coupled to said third node, a control electrode coupled to said third node, and a second current electrode coupled to said input of said hysteresis buffer; and
- a second transistor having a first current electrode coupled to said input of said hysteresis buffer, a control electrode coupled to said third node, and a second current electrode coupled to said second node.

4. The oscillator of claim 3, wherein each of said first transistor and said second transistor is an N-channel metal-oxide-semiconductor (MOS) transistor.

5. The oscillator of claim 1, wherein said hysteresis buffer is a Schmitt trigger.

6. The oscillator of claim 1, wherein each of said first terminal and said second terminal are terminals of an integrated circuit.

7. The oscillator of claim 6, wherein said first capacitor and said second capacitor are formed on said integrated circuit, and said crystal is external to said integrated circuit.

8. The oscillator of claim 7, wherein said voltage shifting circuit and said hysteresis buffer are formed on said integrated circuit.

9. An oscillator driver circuit having a first node and a second node for providing an oscillator output signal, comprising:
- a first capacitor having a first terminal adapted to be coupled to the first node, and a second terminal coupled to ground;
- a second capacitor having a first terminal adapted to be coupled to the second node, and a second terminal coupled to ground;
- an inverter having an input coupled to the first node, and an output coupled to the second node; and
- a voltage shifting circuit coupled to the first node and to the second node and having an input for receiving a tuning signal, wherein said voltage shifting circuit changes an average voltage at the first node according to said tuning signal as a function of a value of a tunable capacitor when an oscillation occurs in response to a crystal being coupled between said first node and said second node.

10. The oscillator driver circuit of claim 9, wherein:
- said voltage shifting circuit further has an input for receiving a tuning signal, wherein said voltage shifting circuit changes said average voltage at the first node during said oscillation according to said tuning signal.

11. The oscillator driver circuit of claim 10, further comprising:

a hysteresis buffer, having an input coupled to one of said first node and said second node, and an output for providing a clock signal having a duty cycle that varies according to said tuning signal.

12. The oscillator driver circuit of claim 11, wherein said hysteresis buffer is a Schmitt trigger.

13. The oscillator driver circuit of claim 11, wherein the first terminal, the second terminal, said first capacitor, said second capacitor, said inverter, said voltage shifting circuit, and said hysteresis buffer are combined on an integrated circuit.

14. The oscillator driver circuit of claim 9, wherein said voltage shifting circuit is characterized as being resistor-less.

15. The oscillator driver circuit of claim 14, wherein said voltage shifting circuit comprises:

a current source having an output terminal for providing a bias current to a third node;

said tunable capacitor having a first terminal coupled to said third node, and a second terminal coupled to ground;

a first transistor having a first current electrode coupled to said third node, a control electrode coupled to said third node, and a second current electrode coupled to the first node; and a second transistor having a first current electrode coupled to the first node, a control electrode coupled to said third node, and a second current electrode coupled to said second node.

16. The oscillator driver circuit of claim 15, wherein each of said first transistor and said second transistor is an N-channel metal-oxide-semiconductor (MOS) transistor.

17. A method of establishing an oscillation using a crystal, comprising:

inverting a signal between a first node adapted to be coupled to a first terminal of the crystal and a second node adapted to be coupled to a second terminal of the crystal;

capacitively coupling said first node to ground;

capacitively coupling said second node to ground; and changing an average voltage at the first node during an oscillation that occurs according to a tuning signal when the crystal is coupled between the first node and the second node, wherein said changing comprises changing a value of a tunable capacitor.

18. The method of claim 17, wherein changing said average voltage comprises changing said average voltage without using a resistor.

19. The method of claim 17, further comprising:

forming an output voltage in response to said average voltage at said first node using a hysteresis buffer.

20. The method of claim 17, wherein changing said average voltage comprises:

providing a bias current to a third node;

coupling said tunable capacitor between said third node and a voltage reference node;

modulating a conductivity of a first transistor coupled between said third node and said first node with a voltage on said third node; and modulating a conductivity of a second transistor coupled between said second node and said first node with said voltage on said third node.

* * * * *